United States Patent
Mourrier et al.

(10) Patent No.: US 10,879,652 B2
(45) Date of Patent: Dec. 29, 2020

(54) AUXILIARY POWER OUTLET WITH LOAD INDUCTANCE MEASUREMENT SYSTEM

(71) Applicant: Infineon Technologies AG, Neubiberg (DE)

(72) Inventors: Andre Mourrier, Manosque (FR); Patrick Vaquette, Rognes (FR)

(73) Assignee: Infineon Technologies AG, Neubiberg (DE)

( * ) Notice: Subject to any disclaimer, the term of this patent is extended or adjusted under 35 U.S.C. 154(b) by 183 days.

(21) Appl. No.: 16/138,385

(22) Filed: Sep. 21, 2018

(65) Prior Publication Data

US 2020/0099176 A1    Mar. 26, 2020

(51) Int. Cl.
  *H01R 13/66* (2006.01)
  *G01R 27/14* (2006.01)
  *H01R 13/703* (2006.01)
  *G01R 27/26* (2006.01)

(52) U.S. Cl.
  CPC ......... *H01R 13/6683* (2013.01); *G01R 27/14* (2013.01); *G01R 27/2611* (2013.01); *H01R 13/703* (2013.01)

(58) Field of Classification Search
  CPC .................................................. H01R 13/6683
  USPC ........................................................ 307/112
  See application file for complete search history.

(56) References Cited

U.S. PATENT DOCUMENTS

| | | | |
|---|---|---|---|
| 4,839,769 A | 6/1989 | Soo et al. | |
| 5,053,940 A | 10/1991 | Peppel | |
| 5,057,765 A | 10/1991 | Clark et al. | |
| 9,755,425 B2 | 9/2017 | Krueter et al. | |
| 2009/0147420 A1 | 6/2009 | Graf et al. | |
| 2011/0121654 A1* | 5/2011 | Recker | H02J 7/0068 307/66 |
| 2012/0008238 A1 | 1/2012 | Thiele | |
| 2013/0257406 A1 | 10/2013 | Hausman, Jr. et al. | |
| 2013/0342948 A1* | 12/2013 | Jankowski | H02H 7/20 361/93.9 |
| 2015/0077243 A1* | 3/2015 | Hooper | H02H 3/16 340/532 |
| 2015/0123637 A1 | 5/2015 | Iwamizu | |
| 2015/0280425 A1* | 10/2015 | Kreuter | H02H 3/087 361/93.1 |
| 2017/0302151 A1* | 10/2017 | Snook | H03K 17/0406 |
| 2017/0302260 A1 | 10/2017 | Iwamizu | |

FOREIGN PATENT DOCUMENTS

| | | |
|---|---|---|
| WO | 2008129365 A1 | 10/2008 |
| WO | 2017040396 A1 | 3/2017 |

* cited by examiner

*Primary Examiner* — Joseph Chang
(74) *Attorney, Agent, or Firm* — Slater Matsil, LLP

(57) ABSTRACT

A method of operating a power system includes connecting an external load to a power outlet of the power system while a power switch of the power system is turned off, where the power switch is coupled between a power supply of the power system and the power outlet; measuring one or more electrical characteristics of the external load while the power switch is turned off; determining, based on the measured one or more electrical characteristics of the external load, whether a demagnetization energy of the external load is within a safe operation range for the power system; and in response to determining that the demagnetization energy of the external load is within the safe operation range, turning on the power switch.

22 Claims, 11 Drawing Sheets

AUXILIARY POWER OUTLET WITH LOAD INDUCTANCE MEASUREMENT SYSTEM

TECHNICAL FIELD

The present invention relates generally to power systems, and, in particular embodiments, to power systems with an auxiliary power outlet (APO) that has a load inductance measurement system.

BACKGROUND

Auxiliary power outlets (APOs) are widely used in many different applications. An exemplary application is the power outlets in cars. The APOs in the car supply electric power from the car battery to electric loads (e.g., portable electronic devices) connected to the APOs. The APOs in the car may also be used to provide electric power for trailers connected to the car.

A typical APO has an electric switch (may also be referred to as a power switch), such as a metal-oxide-semiconductor field-effect transistor (MOSFET), an insulated-gate bipolar transistor (IGBT), a gallium nitride (GaN) transistor, or the like. The electrical switch is coupled between a power supply (e.g., the car battery) connected to an input port of the APO and the electrical load connected to an output port of the APO. By turning on and off the power switch, the power system controls whether electric power is supplied to the load.

Despite the widespread applications for the APOs, challenges remain in the design of power systems with the APOs. There is a need in the art for power systems with APOs that can perform safely for a wide range of electrical loads and can be manufactured at a lower price.

SUMMARY

In accordance with an embodiment of the present invention, a method of operating a power system includes connecting an external load to a power outlet of the power system while a power switch of the power system is turned off, where the power switch is coupled between a power supply of the power system and the power outlet; measuring one or more electrical characteristics of the external load while the power switch is turned off; determining, based on the measured one or more electrical characteristics of the external load, whether a demagnetization energy of the external load is within a safe operation range for the power system; and in response to determining that the demagnetization energy of the external load is within the safe operation range, turning on the power switch.

In accordance with an embodiment of the present invention, a method of operating a power system includes connecting a load to an output port of the power system, where the load is coupled to a power supply of the power system by a power switch, where the power switch is in an OFF state when the load is connected; determining whether a resistance of the load is smaller than a first pre-determined threshold; in response to determining that the resistance of the load is smaller than the first pre-determined threshold, determining whether an inductance of the load is larger than a second pre-determined threshold; and in response to determining that the inductance of the load is larger than the second pre-determined threshold, keeping the power switch in the OFF state.

In accordance with an embodiment of the present invention, a power circuit includes an input port; an output port; and a load inductance measurement system (LIMS) coupled between the input port and the output port, the LIMS comprising: a first measurement circuit configured to measure a resistance of an external load coupled to the output port while a power switch coupled between a power supply and the output port is turned off; and a second measurement circuit configured to measure an inductance of the external load while the power switch is turned off, where the power circuit is configured to turn the power switch on when: the measured resistance of the external load is larger than a first pre-determined threshold; or the measured resistance of the external load is smaller than the first pre-determined threshold, and the measured inductance of the external load is smaller than a second pre-determined threshold.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently disclosed embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely a power system with an APO, where the APO has a load inductance measurement system (LIMS).

In embodiments of the present invention, a power system includes an APO that has a LIMS. The LIMS is used to measure one or more electrical characteristics (e.g., resistance, and/or inductance) of an external load that is connected to an output port of the APO, when a power switch of the APO is in an OFF state. In other words, measurement of the external load is performed before the power switch of the APO is turned on. If the measured one or more electrical characteristics of the external load are outside pre-determined ranges, it is determined that the power system may not be able to operate safely during a turn-off phase of the power switch due to the demagnetization energy of the load, and therefore, the power switch remains turned off so that no electrical power is supplied to the external load. By keeping the power switch turned off, potential damage to the power system during the turn-off phase of the power switch is avoided. The power switch of the APO is turned on only when the one or more measured electrical characteristics indicate that the power system can operate safely during the turn-off phase of the power switch.

In some embodiments, a resistance of the load is measured first. If the measured load resistance is larger than a first threshold, the power system is deemed able to handle the demagnetization energy, and the power switch of the APO is turned on to supply power to the external load. If the measured load resistance is smaller than the first threshold, an inductance of the external load is measured next. If the measured load inductance is smaller than a second threshold, the power system is deemed able to handle the demagnetization energy, and the power switch of the APO is turned on to supply power to the external load. If the measured load inductance is larger than the second threshold, the power switch of the APO remains turned off to avoid damage to the power system.

Figure 1:
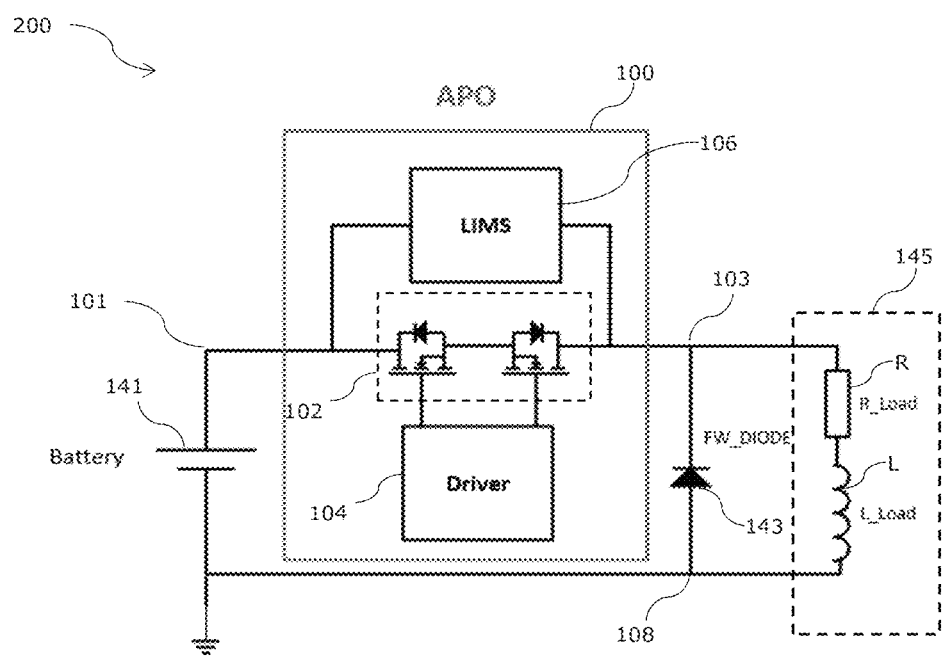
FIG. 1 illustrates a block diagram of a power system with an APO having a load inductance measurement system, in an embodiment.

Referring now to FIG. 1, a block diagram of a power system 200 (also referred to as an auxiliary power supply system) is shown, which includes a power supply 141, an APO 100, and a demagnetization protection device 143. The power supply 141 may also be referred to as a power source, and is illustrated as a battery (e.g., a car battery) in FIG. 1, although any other suitable power source may also be used. The power supply 141 is connected to an input port 101 of the APO 100. In the example of FIG. 1, the demagnetization protection device 143 is a free-wheeling diode connected to an output port 103 of the APO 100. The free-wheeling diode is, of course, a non-limiting example. Any other suitable protection device, such as a transient voltage suppression (TVS) diode, or the like, may be used in place of, or in addition to, the free-wheeling diode. Throughout the discussion herein, unless otherwise specified, same numerals refer to the same or similar elements.

The APO 100 in FIG. 1 includes a driver 104, a power switch 102, and a LIMS 106. The driver 104 is used to turn on or turn off the power switch 102, e.g., by providing a proper gate control voltage to the power switch 102. The driver 104 may be any suitable driver such as a gate driver capable of driving power MOSFETs. The driver 104 comprises discrete components, in some embodiments. In other embodiments, the driver 104 comprises an integrated circuit (IC). The power switch 102 in FIG. 1 has a bi-directional blocking structure, which includes two power transistors (e.g., power MOSFETs) with back-to-back connected body diodes. Other types of power switches, such as power switches with a uni-directional blocking structure, may also be used. The power switches 102 may be formed using one or more MOSFETs, BJTs, GaN transistors, or the like. The LIMS 106 is configured to measure one or more electrical characteristics, such as the resistance and the inductance of the external load. In some embodiments, the LIMS 106 includes a load resistance measurement circuit 320 and a load inductance measurement circuit 330, details of which are discussed hereinafter with reference to FIG. 4. Although FIG. 1 illustrates the LIMS 106 as a circuit outside of (e.g., separate from) the driver 104, the LIMS 106 may be integrated into a same IC as the driver 104.

FIG. 1 further illustrates the external load 145 (also referred to as a load) connected to the output port 103 of the APO 100. In FIG. 1, the external load 145 is modeled as a resistor R (e.g., an equivalent resistance of the load) having a resistance $Rl_{oad}$ (also referred to load resistance) coupled in series with an inductor L (e.g., an equivalent inductor of the load) having an inductance $L_{load}$ (also referred to as load inductance). The above described model of the external load 145 may be sufficient and appropriate in the context of demagnetization protection, as one skilled in the art readily appreciates, although the external load 145 may include various types of electrical components interconnected in various ways. As will be discussed in more detail hereinafter, the load resistance and the load inductance will be measured by the LIMS 106 to determine if the power system can safely handle the demagnetization energy of the load.

Still referring to FIG. 1, when the power switch 102 is turned on, a low impedance electrical path is formed between load path terminals (e.g., source/drain terminals) of the power switches 102, and the power supply 141 is electrically coupled to the output port 103 to provide electrical power (e.g., provide a load current) to the external load 145. When the power switches 102 is turned off (e.g., forming a high impedance electrical path between load path terminals of the power switches 102), the power supply 141 is decoupled from the output port 103, and therefore, does not provide electrical power to the external load.

In some embodiments, when the power switch 102 is turned on, electrical current flows through the inductor L of the load 145 and stores electromagnetic energy in the inductor L; when the power switch is turned off, the electromagnetic field of the inductor L collapses, and the electromagnetic energy stored in the inductor L of the load 145 needs to be dissipated. The electromagnetic energy dissipated during the turn-off phase of the power switch may also be referred to as demagnetization energy. In some embodiments, during the turn-off phase of the power switch 102, the inductor L of the load 145 produces a voltage with a reverse polarity (compared with the polarity of the power supply 141) at the output port 103 of the APO 100. This may also be referred to as the reverse battery issue. The reverse battery issue may cause large voltage and/or large current that, if not handled properly, may damage sensitive semiconductor devices (e.g., the power switches 102) in the power system 200. The demagnetization protection device 143 (e.g., free-wheeling diode) allows the demagnetization current to flow through it and the demagnetization energy dissipated through it, thereby providing certain level of protection for the power system 200 during the turn-off phase of the power switch. The level of protection provided by the demagnetization protection device 143 depends on the current rating and/or the voltage rating of the demagnetization protection device 143. For example, a large size free-wheeling diode can tolerate a higher current and/or a higher voltage, thus providing better protection against the reverse battery issue. However, a large size free-wheeling diode is more expensive and takes up more space.

A challenge with the design and operation of conventional power systems is related to the fact that the inductance of the external load may be unknown and unpredictable. For example, the user of a car may connect loads with a wide range of inductances to the auxiliary power outlet. Loads with large load inductances dissipate large demagnetization energy, since in general, the demagnetization energy is proportional to the load inductance. Therefore, to protect the power system, manufacturers often use over-sized demagnetization protection devices (e.g., over-sized free-wheeling diodes) to protect against the reverse battery issue. However, determining the current rating and/or voltage rating for the over-sized demagnetization protection device is difficult, and even an over-sized demagnetization protection device may not be able to handle all possible loads a user may connect to the auxiliary power outlet. If the demagnetization protection device is blown out during the turn-off phase due to a load with large inductance being connected to the power system, next time a load with large inductance is connected, the demagnetization energy will be dissipated through the circuit of the power system 200 (e.g., through the power switch 102) during the turn-off phase of the power switch, which may damage the power system 200 and may even cause fire.

In some embodiments, the present disclosure addresses the above-described problem of conventional power systems by measuring the electrical characteristics (e.g., load resistance, load inductance) of the load using the LIMS 106, before the power switch 102 is turned on. The measured electrical characteristics are compared with pre-determined thresholds to decide if the power system 200 can safely handle the demagnetization energy of the load 145 during the turn-off phase of the power switch 102. In other words, the power switch 102 is turned on to supply electrical power to the load 145, only after it is determined that the demagnetization energy of the load 145 is within a safe operation range of the power system 200. If the measured electrical characteristics indicate that the power system 200 cannot safely handle the demagnetization energy, the power switch 102 remains turned off, and no electrical power is supplied to the load 145.

Figure 3A:
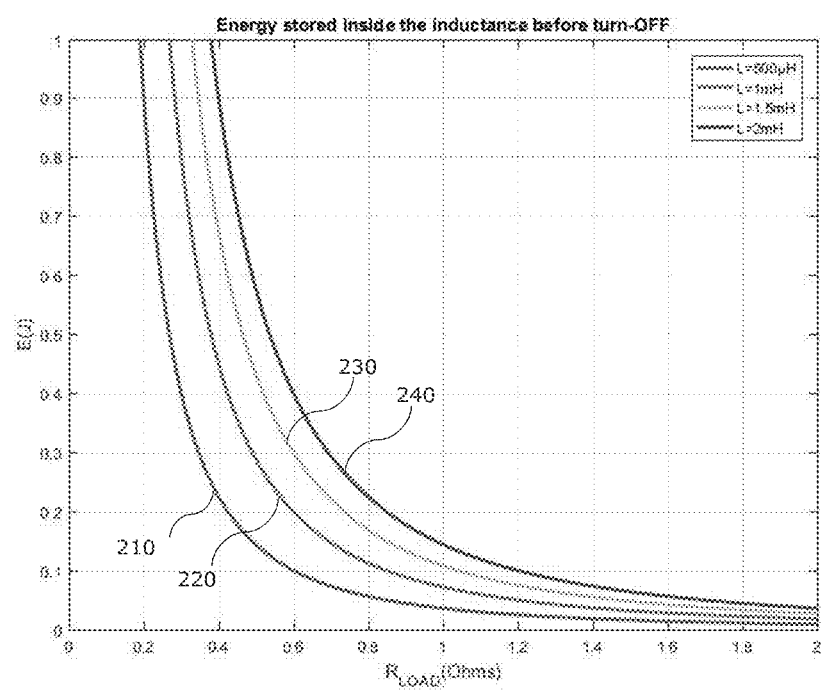
FIG. 3A illustrates relations between load resistance and the energy stored by load inductance, in some embodiments.

For example, a threshold TH1 for the load resistance $R_{load}$ may be determined based on a maximum current $I_{max}$ the demagnetization protection device 143 can safely operate with, using the equation $TH1 \geq V_{bat}/I_{max}$. Referring temporarily to FIG. 3A, which illustrates the relation between the load resistance $R_{load}$ and the energy stored by the load inductance $L_{load}$ the power switch is turned off. In FIG. 3A, four different curves 210, 220, 230, and 240 are illustrated, which correspond to load inductance $L_{load}$ of 500 μH, 1 mH, 1.5 mH, and 2 mH, respectively, with a voltage of 12V for the power supply 141 (e.g., a battery). As illustrated in FIG. 3A, the energy stored by the load inductor L decreases quickly (e.g., by $1/R_{load}^2$) as the load resistance $R_{load}$ increases. In the illustrated example of FIG. 3A, when the load resistance $R_{load}$ is larger than about 2Ω, the energy stored by the load inductor L converges below a small value (e.g., smaller than about 0.03 Joule) and enters an approximately linear region. Therefore, the threshold TH1 may be chosen to be 2Ω for a wide variety of external load 145, in some embodiments. If the measured load resistance $R_{load}$ is larger than the threshold TH1, then the energy dissipated at the turn-off phase of the power switch will be lower than an expected energy level corresponding to the threshold TH1, in some embodiments.

As another example, based on the current rating and/or voltage rating of the demagnetization protection device 143 used in the power system 200, a maximum level of demagnetization energy (which corresponds to a maximum load inductance $L_{max}$ of the external load 145) that can be safely handled by the power system 200 can be determined or estimated through, e.g., calculation and/or simulation. The measured load inductance $L_{load}$ may then be compared with the maximum load inductance $L_{max}$ to decide whether it is safe to turn on the power switch 102. Details regarding the operation of the power system 200 are discussed hereinafter.

Figure 2:
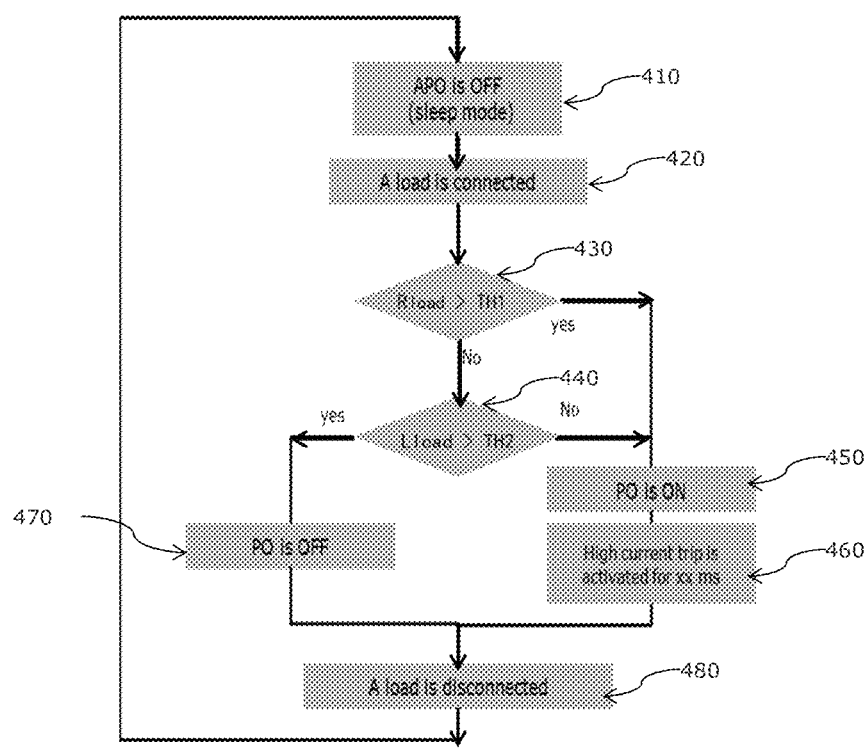
FIG. 2 illustrates a flow diagram for operating the power system of FIG. 1, in an embodiment.

Referring now to FIG. 2, a flow chart of a method for operating the power system 200 of FIG. 1 is illustrated. In FIG. 2, the flow chart starts at block 410, where the APO 100 is turned off initially (e.g., in sleep mode with the power switch 102 turned off). At block 420, the load 145 is connected to (e.g., plugged into) the output port 103 of the APO 100. The APO 100 may detect the connection of the load 145 by sensing a voltage at the output port 103, as discussed in more detail hereinafter. Note that although the load 145 is connected to the output port 103 of the APO 100, the power switch 102 is turned off, so the power supply 141 is electrically decoupled from the load 145 and does not supply electrical power to the load 145.

Next, at block 430, the APO 100 measures the load resistance $R_{load}$ of the load 145 using the LIMS 106, and compares the measured load resistance $R_{load}$ with the threshold TH1 (see discussion above regarding TH1). If the load resistance $R_{load}$ is larger than the threshold TH1, the demagnetization current caused by the demagnetization energy is limited by the load resistance $R_{load}$, and a large portion of the demagnetization energy is dissipated by the load resistance $R_{load}$. Therefore, it is determined that the power system 200 can safely handle the demagnetization energy of the load 145. As a result, the processing proceeds to block 450, where the power outlet is tuned on by turning on the power switch 102, and the power supply 141 supplies a load current to drive the load 145, as illustrated in the block 460.

If the measured load resistance $R_{load}$ is smaller than the threshold TH1, then the APO 100 measures the load inductance $L_{load}$ of the load 145 using the LIMS 106, and compares the measured load inductance $L_{load}$ with a threshold TH2, where TH2 may be the $L_{max}$ discussed above, as illustrated in block 440. If the measured load inductance $L_{load}$ is smaller than the threshold TH2, then it is determined that the power system 200 can safely handle the demagnetization energy of the load 145. As a result, the processing proceeds to block 450, where the power outlet is tuned on by turning on the power switch 102, and next, in the block 460, the power supply 141 supplies a current to drive the load 145.

However, if in block 440, the measured load inductance $L_{load}$ is larger than the threshold TH2, it is determined that the demagnetization energy of the load 145 is outside the safe operation range of the power system 200. As a result, the power switch 102 remains turned off, and the power outlet remains turned off. In block 480, the load 145 is disconnected from the output port 103. The APO 100 detects the disconnection of the load 145, and goes back to sleep mode (back to block 410).

Note that the flow chart of FIG. 2 corresponds to the scenario where an enable signal (see, e.g., enable signal "En" at input port 105 of FIG. 4) for the APO 100 is enabled, thus allowing the APO 100 to function. When the enable signal is disabled, the APO 100 is turned off (e.g., power switch 102 is turned off) regardless of the load 145, and the power supply 141 is decoupled from, thus does not supply electrical power to, the output port 103 of the APO 100. The enable signal of the APO 100 provides an additional level of control for the power system 200. In the example of auxiliary power port in a car, the enable signal may be enabled when the engine of the car is turned on, and the enable signal may be disabled when the engine of the car is turned off to prevent excessive drain of the car battery.

Figure 3B:
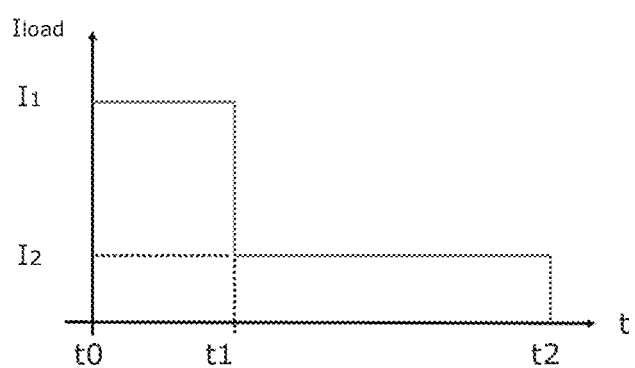
FIG. 3B illustrates a maximum load current flowing into an electric load connected to an APO, in an embodiment.

FIG. 3B illustrates an example of the maximum load current allowed by the power system 200 to be supplied to the load 145 during operation. At time t0, the power switch is turned on to supply a load current to the load 145.

Between time t0 and time t1, a larger maximum current of $I_1$ is allowed by the power system 200 to allow for quick response (e.g., fast ramp up) of the load current. After a while, at time t1, the load current goes into a steady state, and a smaller maximum current $I_2$ is allowed so as to protect the power system 200 from overcurrent. At time t3, the power switch 102 is turned off, no load current is supplied to the load 145.

Figure 4:
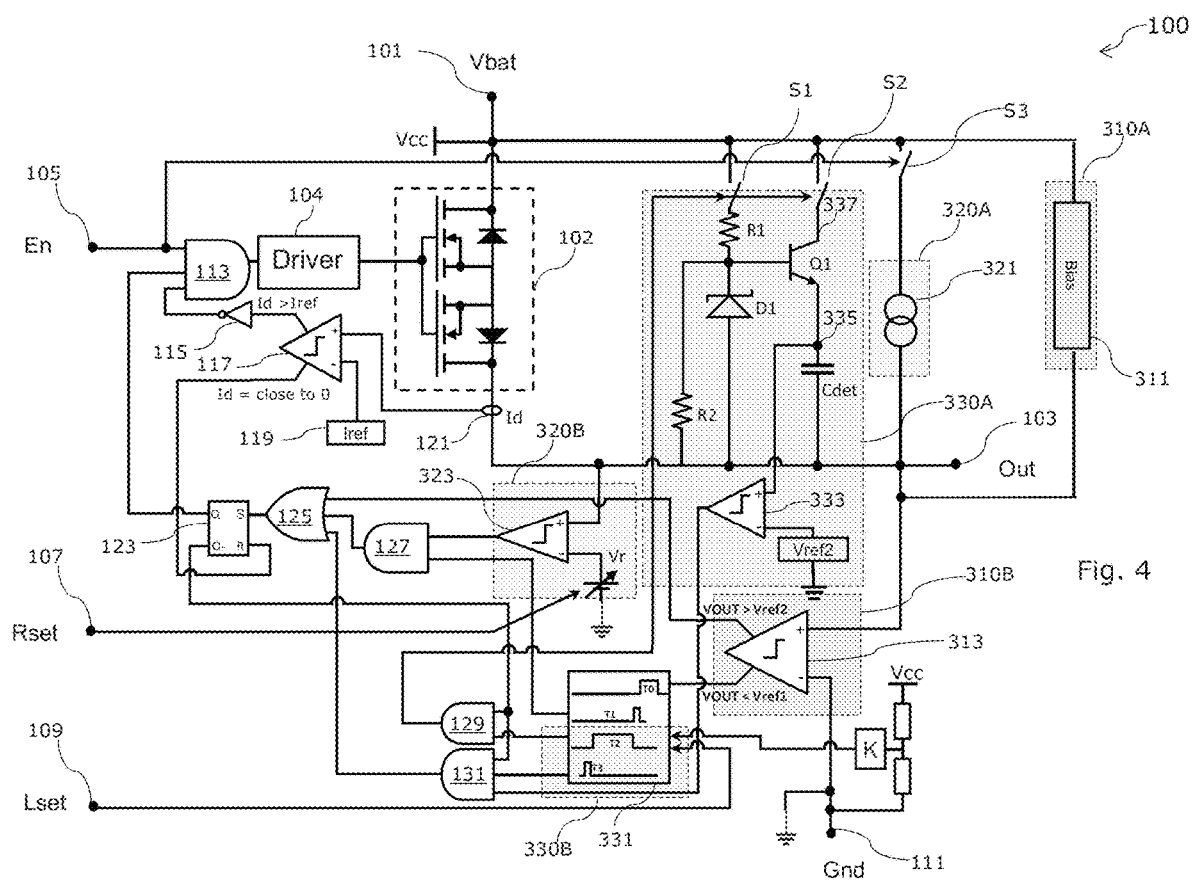
FIG. 4 is a schematic view of the APO of FIG. 1, in an embodiment.

FIG. 4 is a schematic view of the APO 100 of FIG. 1, in an embodiment. Note that to avoid cluttering, no all features of the APO 100 are illustrated in FIG. 4. In some embodiments, the APO 100 is implemented as an integrated circuit (IC), or portions of an IC. As illustrated in FIG. 4, the APO 100 has an input port 101 that is configured to be connected to the power supply 141 (see FIG. 1) with a voltage $V_{bat}$, and has an output port 103 that is configured to be connected to the load 145 (see FIG. 1). In addition, the APO has an input port 105 that is configured to be connected to an enable signal "En" which enables or disable the APO 100. In particular, the enable signal "En" is connected to an input of an AND gate 113, the output of the AND gate 113 is coupled to the driver 104, which driver 104 provides a gate control voltage for the power switch 102. When enable signal "En" has a logic zero value, the output of the AND gate 113 is forced to logic low (e.g., having a logic zero value), which instructs the driver 104 to output a gate control voltage (e.g., a logic low voltage for an N-type MOSFET power switch) that keeps the power switch 102 in an OFF state (or turns off the power switch 102 if the power switch 102 was in an ON state). The enable signal "En" also determines whether a switch S3 may be activated (e.g., closed) or not. For example, when the enable signal "En" is asserted, the switch S3 may be closed when an external load is detected at the output port 103, which activates a load resistance measurement circuit 320 (discussed below) of the APO 100.

The APO 100 has different circuits for various functions. For example, a load detection circuit 310 for detecting the load 145 is illustrated in dashed rectangular regions 310A and 310B, a load resistance measurement circuit 320 for measuring the load resistance $R_{load}$ is illustrated in dashed rectangular regions 320A and 320B, and a load inductance measurement circuit 330 for measuring the load inductance $L_{load}$ is illustrated in dashed rectangular regions 330A and 330B. Details of the load detection circuit 310, the load resistance measurement circuit 320, and the load inductance measurement circuit 330 are discussed hereinafter.

As illustrated in FIG. 4, the load detection circuit 310 includes a bias voltage generator 311, which may be used to generate various bias voltages or reference voltages used in the APO 100. The load detection circuit 310 also includes a comparator 313, which compares a voltage $V_{out}$ at the output port 103 of the APO with reference voltages $V_{ref1}$ and $V_{ref2}$. In some embodiments, the APO 100 detects the status of the load 145 by measuring the voltage $V_{out}$ at the output port 103 while the power switch 102 is turned off. In particular, the APO compares the voltage $V_{out}$ with a low threshold $V_{ref1}$ and a high threshold $V_{ref2}$, where $V_{ref1}$ and $V_{ref2}$ are pre-determined voltage values determined by the design of the APO 100, and $V_{ref2} > V_{bat} - V_{bias} > V_{ref1}$, and $V_{bias}$ is the voltage at the output of the bias voltage generator 311.

For example, if the voltage $V_{out}$ at the output port 103 is between $V_{ref1}$ and $V_{ref2}$, then the APO 100 determines that no load is connected to the output port 103. When the voltage $V_{out}$ is smaller than $V_{ref1}$, this indicates that the load 145 is connected to the output port 103, and the APO 100 proceeds to perform load resistance measurement (see block 430). When the voltage $V_{out}$ is higher than $V_{ref2}$, this indicates that the output port 103 is connected to a power supply (e.g., a battery), which might occur in one of the two scenarios described below. The first scenario is that a proper external load is connected to the output port 103, and the APO 100 turns on the power switch 102 to supply electric power to the external load. The second scenario is that the power switch 102 is initially turned off, and the user is charging the power supply 141 (e.g., a car battery) by applying a charging voltage/current at the output port 103, in which case the power system 200 may enter the charging mode. In the charging mode, a logic high value from the comparator 313 is sent to an input terminal of an OR gate 125 and generates a logic high at the output of the OR gate 125. The output of the OR gate 125 is stored by a flip-flop 123, and the output of the flip-flop 123, after going through the AND gate 113 (assuming enable signal "En" signal is asserted), instructs the driver 104 to turn on the power switch 102. As a result, a charging current flows from the output port 103, through the power switch 102, and into the power supply 141 to charge the power supply 141 (e.g., a battery).

In some embodiments, to protect against overcurrent, a current sensing circuit 121 measures the electrical current flowing through the power switch 102, and compares the measured electrical current with a reference current $I_{ref}$ (see label 119) using a comparator 117. If the measured current is larger than the reference current $I_{ref}$, the comparator 117 generates a logic high signal, which after being inverted by an inverter 115, produces a logic low signal at the output of the AND gate 113. In response, the driver 104 turns off the power switch 102 to prevent damage to the power system due to overcurrent.

In FIG. 4, the load resistance measurement circuit 320 includes a current source 321 and a comparator 323. To perform the load resistance measurement, the enable signal "En" at the input port 105 is asserted, and an external load is detected at the output port 103, and in response, the APO 100 closes the switch S3 to activate the current source 321. The current source 321 supplies a current $I_s$ to the load 145 through the output port 103, while the power switch 102 is still turned off. Due to the load resistance $R_{load}$ of the load 145, the voltage $V_{out}$ at the output port 103 is proportional to the $R_{load}$ (e.g., $V_{out} = I_s \times R_{load}$, assuming the current source 321 is an ideal current source). The comparator 323 compares $V_{out}$ with a reference voltage $V_r$, which reference voltage $V_r$ is related to the threshold TH1 (see block 430 in FIG. 2) by $V_r = I_s \times TH1$. In other words, by comparing the voltages $V_{out}$ and $V_r$ (which are proportional to the respective resistances), the comparator 323 effectively compares the measured load resistance $R_{load}$ with the threshold TH1. When the voltage $V_{out}$ is larger than the reference voltage Vr, the comparator 323 generates a logic high output which, after going through the logic gates (e.g., 127, 125, 123, 113) described above, instructs the driver 104 to turn on the power switch 102 (see block 450 in FIG. 2). In FIG. 4, an input port 107 is used for setting the reference voltage $V_r$ (which is equivalent to setting the threshold TH1 for a given current source $I_s$), where the reference voltage $V_r$ is a variable (e.g., programmable) reference voltage. After the load resistance measurement is finished, the switch S3 is opened again. A timing circuit 331 of the APO 100 may generate a timing pulse to open the switch S3 after the load resistance measurement is finished.

Once the comparator 323 generates the logic high output (e.g., $R_{load} > TH1$), the power switch 102 may be turned on, and there is no need to perform the load inductance measurement. The complement output of the flip-flop 123, which is logic zero in this case, is sent to input terminals of AND gates 129 and 131, thus forcing the outputs of the AND gates 129 and 131 to be logic zero. The logic zero output of the AND gate 129 is used to keep the switches S1 and S2 open, thus disabling the load inductance measurement circuit 330.

If the measured load resistance $R_{load}$ is smaller than the threshold TH1, then the APO 100 proceeds to perform measurement of the load inductance $L_{load}$ (see block 440 of FIG. 2). In this case, the output of the comparator 323 of the load resistance measurement circuit 320 is logic low, the complement output of the flip-flop 123 is logic high, and the output of the AND gate 129 is logic high, so that the switches S1 and S2 are closed to activate the load inductance measurement circuit 330. Note that the timing circuit 331 generates appropriate timing pulses (e.g., pulses used for control timing), and at least one of the timing pulses is sent to the AND gate 129, such that the combination of the timing pulse and the complement output of the flip-flop 123 generates a logic high signal at the output of the AND gate 129 to activate the load inductance measurement circuit 330. For simplicity of illustration, details of the timing circuit 331 are not discussed herein. In FIG. 4, the dashed rectangular region 330B is drawn to cover portions of the timing circuit 331 to indicate that some, but not all, of the timing pulses generated by the timing circuit 331 are used by the load inductance measurement circuit 330.

Still referring to FIG. 4, the load inductance measurement circuit 330 measures the load inductance $L_{load}$ by supplying a voltage pulse (e.g., a step change in voltage) to the load inductance measurement circuit while the power switch 102 is turned off, and by measuring a duration for a voltage $V_{cdet}$ at a node 335 of the load inductance measurement circuit 330 to rise to a pre-determined threshold. As discussed above, the timing circuit 331 may generate a timing pulse at the input of the AND gate 129, so that the output of the AND gate 129 is logic high, and as a result, the switches S1 and S2 are closed to activate the load inductance measurement circuit 330. The switches S1 and S2 may stay closed for a period of time (e.g., a few hundred milliseconds), and after the load inductance measurement is finished, the switches S1 and S2 are opened.

As illustrated in FIG. 4, the load inductance measurement circuit 330 includes a transistor Q1 (e.g., a BJT transistor), a capacitor $C_{det}$ coupled between an emitter of the transistor Q1 and the output port 103, a diode D1 (e.g., a Zener diode) coupled between the base of the transistor Q1 and the output port 103, and a resistor R1 coupled between the collector of the transistor Q1 and the base of the transistor Q1. The load inductance measurement circuit 330 further includes a resistor R2, a comparator 333, and (portions of) the timing circuit 331. In the illustrated embodiment, due to the feedback path provided by the diode D1 (e.g., a Zener diode), the voltage response (measured at the node 335) of the load inductance measurement circuit 330 behaves as a non-linear function, and the voltage response is different from a classic RLC second order filter, as will be discussed in more detail hereinafter.

Figure 5:
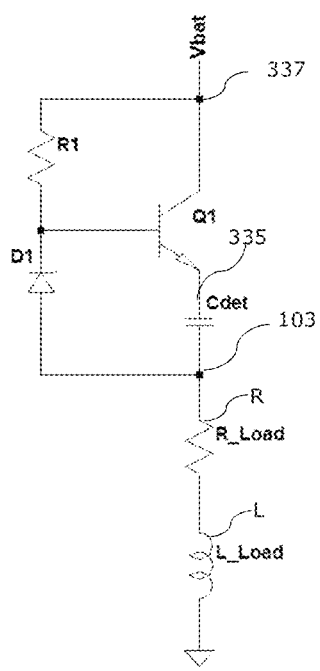
FIG. 5 illustrates an RLC circuit, in an embodiment.

In FIG. 5, an RLC circuit is formed by electrical components (e.g., transistor Q1, diode D1, resistor R1, and capacitor $C_{det}$) of the load inductance measurement circuit 330 and electrical components (the load resistor R, and the load inductance L) of the load 145. In particular, the load resistor R, and the load inductor L, and the capacitor $C_{det}$ provide the resistor, the inductor, and the capacitor of the RLC circuit. Note that due to the feedback of the diode D1 (e.g., a Zener diode), the voltage response at the node 335 is different from that of the classic RLC filter, where the node 335 is a node between the transistor Q1 and the capacitor $C_{det}$. In the discussion below, $C_{det}$ may also be used to denote the capacitance of the capacitor $C_{det}$.

Figure 6:
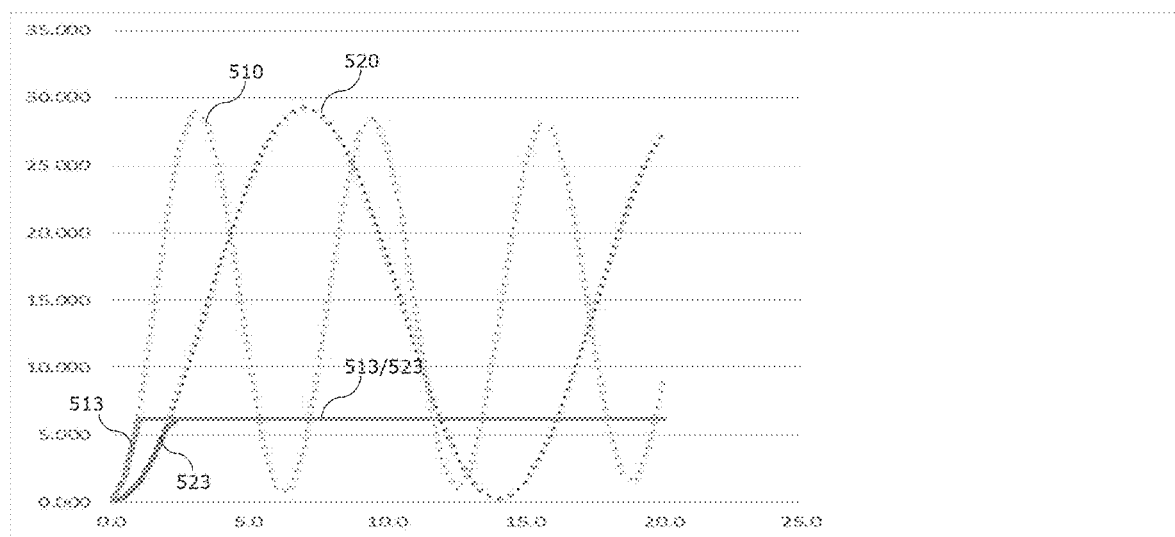
FIG. 6 illustrates the voltage responses of various RLC circuits, in some embodiments.

Referring to FIG. 6, curves 513 and 523 illustrate the time response of the RLC circuit of FIG. 5 (measured at the node 335 in response to a step voltage input) with different values for the load inductance $L_{load}$. The x-axis represents time in units of seconds, and the y-axis represents voltage in units of volts. In particular, the curve 523 corresponds to a larger load inductance than the curve 513. For comparison, curves 510 and 520 illustrate the voltage response of an RLC circuit similar to that of FIG. 5, but with the diode D1 removed. In particular, the curve 510 corresponds to the curve 513, and the curve 520 corresponds to the curve 523, but with the diode D1 removed. It is seen that a larger load inductance corresponds to a slower change in the voltage response. In addition, due to the voltage clamping of the Zener diode (e.g., D1), the voltage response (curves 513/523) of the RLC circuit of FIG. 5 does not oscillate. The beginning portion (e.g., the portion before the frequency response plateaus) of the frequency response curves (e.g., 513, 523) may be used to measure the load inductance, as discussed below with reference to FIG. 7.

Figure 7:
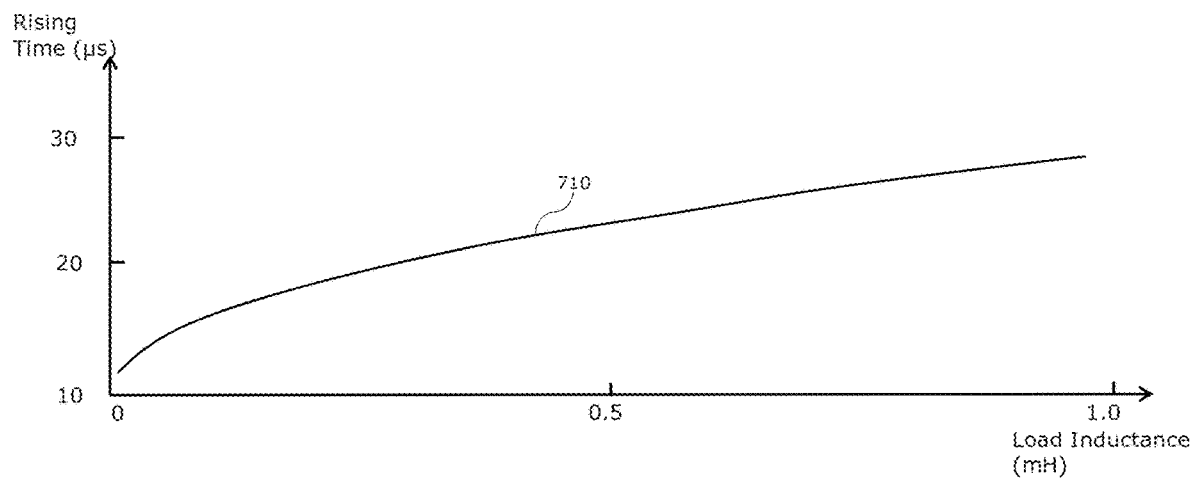
FIG. 7 illustrates an relation between the rising time of the RLC circuit of FIG. 5 and the load inductance, in an embodiment.

Referring to FIG. 7, for a given load resistance $R_{load}$ and a given capacitance $C_{det}$, the relation between the load inductance $L_{load}$ and a rising time $T_R$ for the voltage $V_{cdet}$ measured at the node 335 can be plotted (or tabulated) as a curve 710, where the rising time $T_R$ is a duration between a first time instant and a second time instant, where the first time instant is when a voltage pulse is applied at the node 337 (e.g., when switches S1 and S2 are closed), and the second time instant is when the voltage $V_{cdet}$ reaches a pre-determined threshold (e.g., $V_{ref2}$). In some embodiments, as an empirical rule, the rising time $T_R$ may be considered as independent of the load resistance $R_{load}$, when the following condition is satisfied: $L_{load}/R_{load} \geq 100 \times R_{load} \times C_{det}$. Since the capacitance $C_{det}$ of the load inductance measurement circuit 330 is known, it is therefore possible to use a single curve, such as the curve 710, to describe the relation between the load inductance $L_{load}$ and the rising time $T_R$. For example, the curve 710 may be used to covert a measured rising time $T_R$ into a corresponding load inductance $L_{load}$, regardless of the load resistance $R_{load}$ as long as the above condition is satisfied. The conversion between the rising time and the load inductance is possible due to the one-to-one mapping relation between the rising time and the load inductance, as shown in FIG. 7. In other embodiments, multiple curves similar to the curve 710 may be produced (each corresponding to a different load resistance $R_{load}$) and may be used to convert a measured rising time $T_R$ into a corresponding load inductance $L_{load}$, where the curve corresponding to a load resistance closest to the measured load resistance is used for the conversion.

Referring back to FIG. 4, during measurement of the load inductance, the voltage $V_{cdet}$ at the node 335 is sent to an input terminal of the comparator 333, and is compared with the reference voltage $V_{ref2}$. The rising time $T_R$, which is the duration between the time instant the voltage pulse is applied (e.g., when the switches S1 and S2 are closed) and the time instant the voltage $V_{cdet}$ reaches (e.g., crosses, rises above) the reference voltage $V_{ref2}$, is measured. The rising time $T_R$ is then converted to the load inductance $L_{load}$ using curve 710 of FIG. 7, in some embodiments. The measured load inductance $L_{load}$ is compared with the threshold TH2 (see block 440 of FIG. 2) to decide whether the demagnetization energy is within a safe range of the power system 200, in some embodiments. Another embodiment for determining whether the demagnetization energy is within a safe range of the power system 200, which may be easier to implement, is discussed hereinafter.

In another embodiment, the maximum load inductance (e.g., TH2) that can be safely handled by the power system 200 is converted to a maximum rising time $T_{RMAX}$ using, e.g., the curve 710. Referring to FIG. 4, during the load inductance measurement process, a timer of the timing circuit 331, such as a counter-down timer which expires after a set period of time (e.g., $T_{RMAX}$), is started when the voltage pulse is applied to the RLC circuit (e.g., when the switches S1 and S2 are closed). The timer may produce a timing pulse (having a logic high value) starting at the time instant when the switches S1 and S2 are closed, and stopping after a duration of $T_{RMAX}$.

If the voltage $V_{cdet}$ at the node 335 reaches the predetermined threshold (e.g., reference voltage $V_{ref2}$) before the timer expires (e.g., when the timing pulse still have a logic high value), the output of the comparator 333, which is logic high in this case, is sent to a first input terminal of the AND gate 131. The time circuit 331 sends a timing pulse with logic high value to a second input terminal of the AND gate 131 while the timer is counting down (and before it expires). As a result, a logic high signal is generated at the output of the AND gate 131. The logic high signal at the output of the AND gate 131, after going through the logic gates (e.g., 125, 123, 113), instructs the driver 104 to turn on the power switch 102.

If the voltage $V_{cdet}$ at the node 335 rises too slow (due to a large load inductance) and does not reach the reference voltage $V_{refe2}$ before the timer expires, the output of the AND gate 131 is a logic low signal, which will cause the driver 104 to keep the power switch 102 in an OFF state.

FIGS. 8A, 8B, 8C, and 8D illustrate timing diagrams of the power system 200 of FIG. 1 operating under different load conditions, in some embodiments. Note that in FIGS. 8A-8D, time instants with the same label (e.g., Ta, Tb, Tc, Td, and Te) but in different figures may refer to different time. For example, the time instant labeled as Tc in FIG. 8A may refer to a time different from the time instant labeled as Tc in FIG. 8B. The voltage V in each of the figures refers to the voltage at the node 335 of FIG. 4. Note that during each different stages of processing (e.g., load resistance measurement, load inductance measurement), the voltage V may correspond to different measured voltages. For example, during the load resistance measurement, the voltage V is equal to the voltage $V_{out}$ at the output poll 103, and during the load inductance measurement, the voltage V is equal to the voltage $V_{cdet}$ at the node 335. In addition, when the power switch 102 is turned on, the voltage V is equal to the charging voltage at the output port 103 (e.g., $V_{bat}$) plus the voltage $V_{cdet}$ across the capacitor $C_{det}$.

Figure 8A:
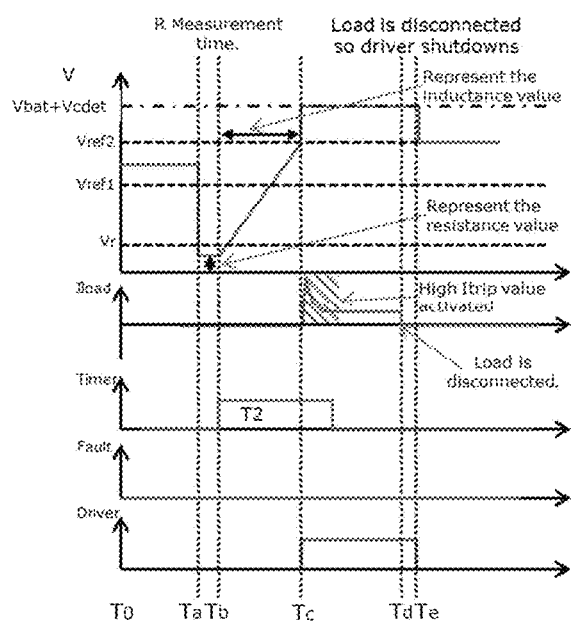
FIGS. 8A, 8B, 8C, and 8D illustrate timing diagrams of the power system of FIG. 1 operating under different load conditions, in some embodiments.

FIG. 8A illustrates a timing diagram for an embodiment where the load resistance $R_{load}$ is smaller than the threshold TH1 and the load inductance $L_{load}$ is smaller than the threshold TH2. FIG. 8A represents a case where no external load is connected to the output port 103 of the APO 100 at time $T_o$, and the voltage $V_{out}$ at the output port 103 is between $V_{ref1}$ and $V_{ref2}$ at time $T_o$. The power switch 102 is turned off initially, as indicated by the logic low value of the driver 104 at time $T_o$. At time Ta, an external load is connected to the output port 103, and the APO 100 starts measurement of the load resistance of the load 145 using the load resistance measurement circuit 320. The current source 321 (see FIG. 4) supplies a current to the load 145, which cause the voltage $V_{out}$ to drop to a value proportional to the load resistance (e.g., $I_s \times R_{load}$) and smaller than the threshold voltage $V_r$. At time Tb, the load resistance measurement is finished. Since the voltage $V_{out}$ at the output port 103 is smaller than the threshold voltage $V_r$, the APO 100 decides that the load resistance $R_{load}$ is smaller than TH1, and thus, measurement of the load inductance needs to be performed. Therefore, the load inductance measurement circuit 330 is activated at time Tb, and the timer in the timing circuit 331 is started at time Tb. The voltage $V_{cdet}$ at the node 335 rises over time and reaches the reference voltage $V_{ref2}$ at time Tc, before the timer expires, which indicates that the load inductance $L_{load}$ is smaller than the threshold TH2. Therefore, the APO 100 determines that the demagnetization energy is within the safe range, and instructs the driver 104 to output a logic high value to turn on the power switch 102 at time Tc. As a result, the power supply 141 (e.g., a battery) is electrically coupled to the output port 103 at time Tc, and the voltage V at the node 335 is now $V_{bat} + V_{cdet}$. Also, at time Tc, a load current $I_{load}$ flows from the power supply 141 into the load 145 to supply electric power. At time Td, the load 145 is disconnected, and the load current $I_{load}$ stops. The APO 100 detects the disconnection of the load 145 and shuts down the driver 104 at time Te, and as a result, the voltage V drops back to $V_{ref2}$ at time Te.

Figure 8B:
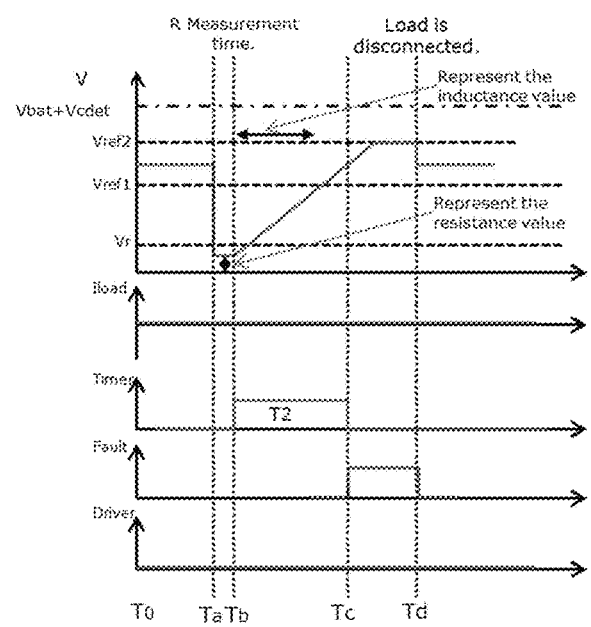

FIG. 8B illustrates a timing diagram for an embodiment where the load resistance $R_{load}$ is smaller than the threshold TH1 and the load inductance $L_{load}$ is larger than the threshold TH2. The timing diagram up to time Tb is similar to that of FIG. 8A. The APO 100 performs load resistance measurement between time Ta and time Tb, and determines that the load resistance $R_{load}$ is smaller than the threshold TH1. As a result, the load inductance measurement is started at time Tb, and the timer is started at time Tb. However, due to a large load inductance, the voltage $V_{cdet}$ at the node 335 rises slowly and does not reach the reference voltage $V_{ref2}$ before the timer expires at time Tc. As a result, the APO 100 determines that the demagnetization energy is outside the safe range of the power system 200, the "Fault" signal becomes high at time Tc to indicate the fault condition, and the output of the driver 104 remains low, thus keeping the power switches 102 turned off. At time Td, the load 145 is disconnected, the voltage $V_{out}$ at the output port 103 drops to a value between $V_{ref1}$ and $V_{ref2}$.

Figure 8C:
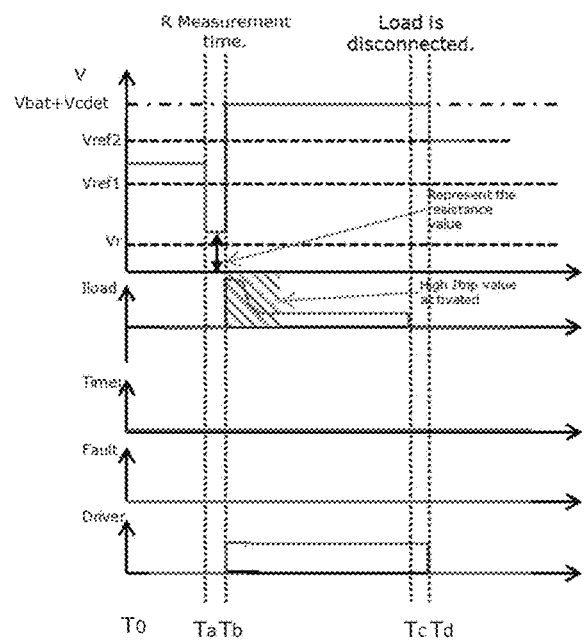

FIG. 8C illustrates a timing diagram for an embodiment where the load resistance $R_{load}$ is larger than the threshold TH1. At time Ta, the load 145 is connected to the output port 103. Between time Ta and Tb, the load resistance measurement is performed. Since the voltage $V_{out}$ at the output port 103 is above the threshold voltage $V_r$, this indicates that the load resistance $R_{load}$ is above the threshold TH1, and it is safe to turn on the power switch 102. Therefore, at time Tb, the driver 104 outputs a logic high value to turn on the power switch 102. As a result, the power supply 141 (e.g., a battery) is electrically coupled to the output port 103 at time Tb, and the voltage V is now $V_{bat} + V_{cdet}$. A time Tb, a load current $I_{load}$ flows from the power supply 141 into the load 145 to supply electric power. At time Tc, the load is disconnected, and the load current $I_{load}$ stops. The APO 100 detects the disconnection of the load 145 and shuts down the driver 104 at time Td, and as a result, the voltage V drops back to $V_{ref2}$ at time Td.

Figure 8D:
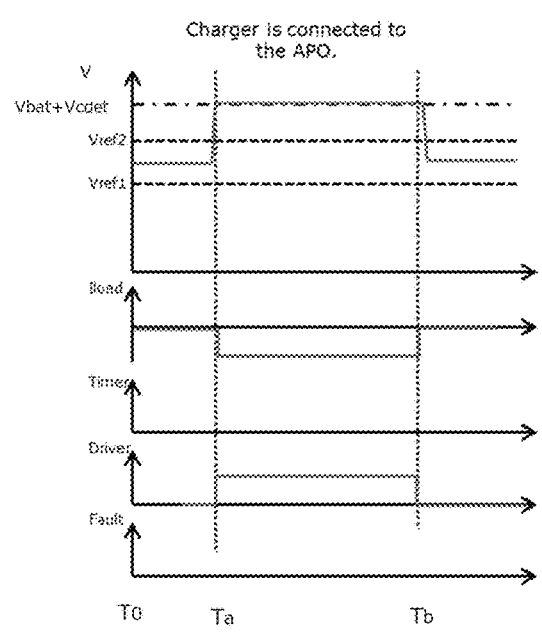

FIG. 8D illustrates a timing diagram for an embodiment where the user is charging the power supply 141. At time Ta, the user applies a charging voltage, which is higher than the reference voltage $V_{ref2}$. The APO 100 detects the charging mode, and output a logic high value at the output of the driver 104 to turn on the power switch 102 to allow charging. The charging current starts at time Ta, which flows from the output port 103 into the power supply 141 and is illustrated as a negative current to indicate the reverse direction of current flow than normal mode. The charging continues from time Ta to time Tb, during which time the voltage V at the node 335 is equal to $V_{bat}+V_{cdet}$. At time Tb, the charging ends, the load current stops, and the voltage V drops to a value between $V_{ref1}$ and $V_{ref2}$.

Figure 9:
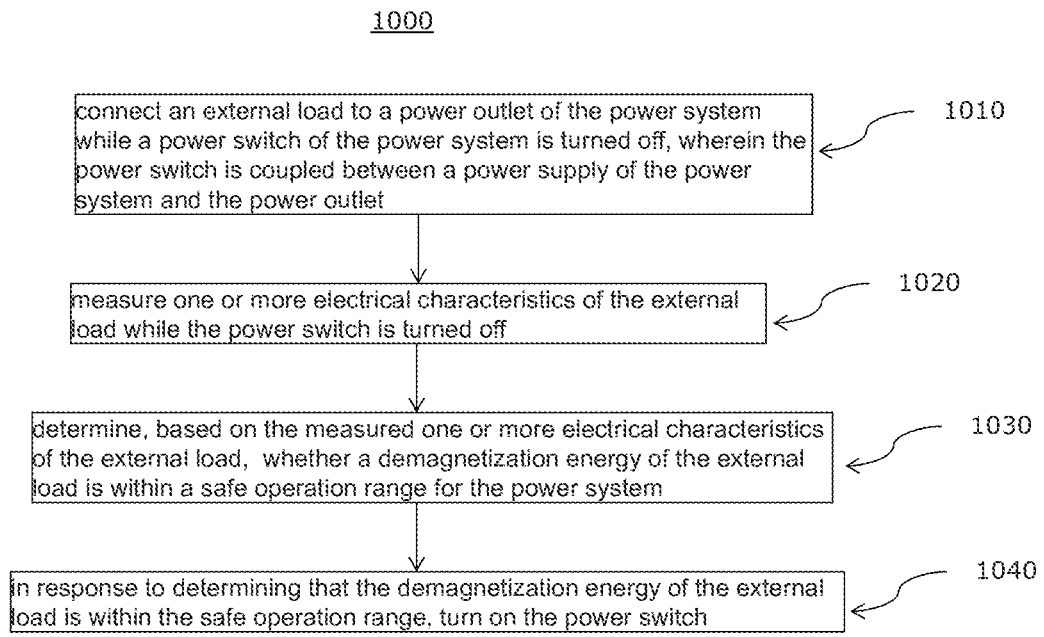
FIG. 9 is a flow chart of a method of operating a power system, in some embodiments.

FIG. 9 illustrates a flow chart of a method 1000 of operating a power system in accordance with some embodiments. It should be understood that the embodiment method shown in FIG. 9 is merely an example of many possible embodiment methods. One of ordinary skill in the art would recognize many variations, alternatives, and modifications. For example, various steps as illustrated in FIG. 9 may be added, removed, replaced, rearranged and repeated.

Referring to FIG. 9, at block 1010, an external load is connected to a power outlet of the power system while a power switch of the power system is turned off, wherein the power switch is coupled between a power supply of the power system and the power outlet. At block 1020, one or more electrical characteristics of the external load are measured while the power switch is turned off. At block 1030, based on the measured one or more electrical characteristics of the external load, whether a demagnetization energy of the external load is within a safe operation range for the power system is determined. At block 1040, in response to determining that the demagnetization energy of the external load is within the safe operation range, the power switch is turned on.

Embodiments may achieve advantages. For example, embodiments of the presently disclosed power system determines, before the power switch is turned on, whether the demagnetization energy of the load is within a safe operation range of the power system. The power switch is turned on only after it is determined that the power system can safely handle the demagnetization energy of the load. This avoids or reduces the possibility that the power system is damaged by the demagnetization energy. Due to the disclosed method and structure, the size of the demagnetization protection devices, such as the free-wheeling diode, is easier to determine and do not need to be overly over-sized, which saves component cost and reduces the size of the power system.

Example embodiments of the present invention are summarized here. Other embodiments can also be understood from the entirety of the specification and the claims filed herein.

Example 1

In an embodiment, a method of operating a power system includes connecting an external load to a power outlet of the power system while a power switch of the power system is turned off, wherein the power switch is coupled between a power supply of the power system and the power outlet; measuring one or more electrical characteristics of the external load while the power switch is turned off; determining, based on the measured one or more electrical characteristics of the external load, whether a demagnetization energy of the external load is within a safe operation range for the power system; and in response to determining that the demagnetization energy of the external load is within the safe operation range, turning on the power switch.

Example 2

The method of Example 1, wherein measuring one or more electrical characteristics of the external load comprises measuring a resistance of the external load.

Example 3

The method of Example 2, wherein measuring the resistance of the external load comprises: supplying a current to the external load through the power outlet; and measuring a voltage drop across the external load.

Example 4

The method of Example 2, wherein the determining comprises: comparing the measured resistance of the external load with a first pre-determined threshold; and determining that the demagnetization energy of the external load is within the safe operation range when the measured resistance is larger than the first pre-determined threshold.

Example 5

The method of Example 4, wherein measuring one or more electrical characteristics of the external load further comprises measuring an inductance of the external load when the measured resistance is smaller than the first pre-determined threshold.

Example 6

The method of Example 5, wherein the determining comprises: comparing the measured inductance with a second pre-determined threshold; and determining that the demagnetization energy of the external load is within the safe operation range when the measured inductance is smaller than the second pre-determined threshold.

Example 7

The method of Example 5, wherein measuring the inductance of the external load comprises: coupling a first terminal of a capacitor to the power outlet; applying a voltage pulse to a second terminal of the capacitor; starting a timer when the voltage pulse is applied, wherein the timer expires after a pre-determined duration; and detecting whether a voltage at the second terminal of the capacitor reaches a pre-determined voltage value before the timer expires.

Example 8

The method of Example 7, wherein the determining comprises determining that the demagnetization energy of the external load is within the safe operation range when the voltage at the second terminal of the capacitor reaches the pre-determined voltage value before the timer expires.

Example 9

The method of Example 5, wherein measuring the inductance of the external load comprises: coupling a first terminal of a capacitor to the power outlet; applying a voltage pulse to a second terminal of the capacitor; and measuring a duration between a first time instant when the voltage pulse is applied and a second time instant when a voltage at the second terminal of the capacitor reaches a pre-determined voltage value.

Example 10

The method of Example 9, wherein measuring the inductance of the external load further comprises converting the measured duration into an inductance value using a pre-determined relation between the measured duration and the inductance value.

Example 11

The method of Example 1, wherein the determining comprises: determining that the demagnetization energy of the external load is outside the safe operation range when a measured resistance of the external load is smaller than a first pre-determined threshold, and a measured inductance of the external load is larger than a second pre-determined threshold.

Example 12

The method of Example 11, further comprising: in response to determining that the demagnetization energy of the external load is outside the safe operation range, keeping the power switch turned off.

Example 13

A method of operating a power system includes connecting a load to an output port of the power system, wherein the load is coupled to a power supply of the power system by a power switch, wherein the power switch is in an OFF state when the load is connected; determining whether a resistance of the load is smaller than a first pre-determined threshold; in response to determining that the resistance of the load is smaller than the first pre-determined threshold, determining whether an inductance of the load is larger than a second pre-determined threshold; and in response to determining that the inductance of the load is larger than the second pre-determined threshold, keeping the power switch in the OFF state.

Example 14

The method of Example 13, further comprising: in response to determining that the resistance of the load is larger than the first pre-determined threshold, switching on the power switch.

Example 15

The method of Example 13, further comprising: in response to determining that the inductance of the load is smaller than the second pre-determined threshold, switching on the power switch.

Example 16

The method of Example 13, wherein determining whether the resistance of the load is smaller than the first pre-determined threshold comprises: supplying a current to the load through the output port while the power switch is in the OFF state; and comparing a voltage drop across the load with a pre-determined voltage value.

Example 17

The method of Example 13, wherein determining whether the inductance of the load is larger than the second pre-determined threshold comprises: supplying a voltage pulse to a first terminal of a capacitor while the power switch is in the OFF state, wherein a second terminal of the capacitor is connected to the output port; and detecting whether a voltage at the first terminal of the capacitor rises to a pre-determined voltage value within a pre-determined duration.

Example 18

A power circuit includes an input port; an output port; and a load inductance measurement system (LIMS) coupled between the input port and the output port, the LIMS comprising: a first measurement circuit configured to measure a resistance of an external load coupled to the output port while a power switch coupled between a power supply and the output port is turned off; and a second measurement circuit configured to measure an inductance of the external load while the power switch is turned off, wherein the power circuit is configured to turn the power switch on when: the measured resistance of the external load is larger than a first pre-determined threshold; or the measured resistance of the external load is smaller than the first pre-determined threshold, and the measured inductance of the external load is smaller than a second pre-determined threshold.

Example 19

The power circuit of Example 18, further comprising the power switch, wherein the power switch is coupled between the input port and the output port.

Example 20

The power circuit of Example 19, further comprising the power supply, wherein the power supply is coupled to the input port, and is configured to supply electric power to the external load when the power switch is turned on.

Example 21

The power circuit of Example 18, wherein the power circuit is configured to measure the inductance of the external load after determining that the measured resistance is smaller than the first pre-determined threshold.

Example 22

The power circuit of Example 18, wherein the power circuit is configured to keep the power switch turned off when the measured resistance of the external load is smaller than the first pre-determined threshold, and the measured inductance of the external load is larger than the second pre-determined threshold.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. A method of operating a power system, the method comprising:
connecting an external load to a power outlet of the power system while a power switch of the power system is turned off, wherein the power switch is coupled between a power supply of the power system and the power outlet;
measuring one or more electrical characteristics of the external load while the power switch is turned off;
determining, based on the measured one or more electrical characteristics of the external load, whether a demagnetization energy of the external load is within a safe operation range for the power system; and
in response to determining that the demagnetization energy of the external load is within the safe operation range, turning on the power switch.

2. The method of claim 1, wherein measuring one or more electrical characteristics of the external load comprises measuring a resistance of the external load.

3. The method of claim 2, wherein measuring the resistance of the external load comprises:
supplying a current to the external load through the power outlet; and
measuring a voltage drop across the external load.

4. The method of claim 2, wherein the determining comprises:
comparing the measured resistance of the external load with a first pre-determined threshold; and
determining that the demagnetization energy of the external load is within the safe operation range when the measured resistance is larger than the first pre-determined threshold.

5. The method of claim 4, wherein measuring one or more electrical characteristics of the external load further comprises measuring an inductance of the external load when the measured resistance is smaller than the first pre-determined threshold.

6. The method of claim 5, wherein the determining comprises:
comparing the measured inductance with a second pre-determined threshold; and
determining that the demagnetization energy of the external load is within the safe operation range when the measured inductance is smaller than the second pre-determined threshold.

7. The method of claim 5, wherein measuring the inductance of the external load comprises:
coupling a first terminal of a capacitor to the power outlet;
applying a voltage pulse to a second terminal of the capacitor;
starting a timer when the voltage pulse is applied, wherein the timer expires after a pre-determined duration; and
detecting whether a voltage at the second terminal of the capacitor reaches a pre-determined voltage value before the timer expires.

8. The method of claim 7, wherein the determining comprises determining that the demagnetization energy of the external load is within the safe operation range when the voltage at the second terminal of the capacitor reaches the pre-determined voltage value before the timer expires.

9. The method of claim 5, wherein measuring the inductance of the external load comprises:
coupling a first terminal of a capacitor to the power outlet;
applying a voltage pulse to a second terminal of the capacitor; and
measuring a duration between a first time instant when the voltage pulse is applied and a second time instant when a voltage at the second terminal of the capacitor reaches a pre-determined voltage value.

10. The method of claim 9, wherein measuring the inductance of the external load further comprises converting the measured duration into an inductance value using a pre-determined relation between the measured duration and the inductance value.

11. The method of claim 1, wherein the determining comprises:
determining that the demagnetization energy of the external load is outside the safe operation range when a measured resistance of the external load is smaller than a first pre-determined threshold, and a measured inductance of the external load is larger than a second pre-determined threshold.

12. The method of claim 11, further comprising:
in response to determining that the demagnetization energy of the external load is outside the safe operation range, keeping the power switch turned off.

13. A method of operating a power system, the method comprising:
connecting a load to an output port of the power system, wherein the load is coupled to a power supply of the power system by a power switch, wherein the power switch is in an OFF state when the load is connected;
determining whether a resistance of the load is smaller than a first pre-determined threshold;
in response to determining that the resistance of the load is smaller than the first pre-determined threshold, determining whether an inductance of the load is larger than a second pre-determined threshold; and
in response to determining that the inductance of the load is larger than the second pre-determined threshold, keeping the power switch in the OFF state.

14. The method of claim 13, further comprising:
in response to determining that the resistance of the load is larger than the first pre-determined threshold, switching on the power switch.

15. The method of claim 13, further comprising:
in response to determining that the inductance of the load is smaller than the second pre-determined threshold, switching on the power switch.

16. The method of claim 13, wherein determining whether the resistance of the load is smaller than the first pre-determined threshold comprises:
supplying a current to the load through the output port while the power switch is in the OFF state; and
comparing a voltage drop across the load with a pre-determined voltage value.

17. The method of claim 13, wherein determining whether the inductance of the load is larger than the second pre-determined threshold comprises:
supplying a voltage pulse to a first terminal of a capacitor while the power switch is in the OFF state, wherein a second terminal of the capacitor is connected to the output port; and
detecting whether a voltage at the first terminal of the capacitor rises to a pre-determined voltage value within a pre-determined duration.

18. A power circuit comprising:
an input port;
an output port; and a load inductance measurement system (LIMS) coupled between the input port and the output port, the LIMS comprising:
  a first measurement circuit configured to measure a resistance of an external load coupled to the output port while a power switch coupled between a power supply and the output port is turned off; and
  a second measurement circuit configured to measure an inductance of the external load while the power switch is turned off,
wherein the power circuit is configured to turn the power switch on when:
  the measured resistance of the external load is larger than a first pre-determined threshold; or
  the measured resistance of the external load is smaller than the first pre-determined threshold, and the measured inductance of the external load is smaller than a second pre-determined threshold.

19. The power circuit of claim 18, further comprising the power switch, wherein the power switch is coupled between the input port and the output port.

20. The power circuit of claim 19, further comprising the power supply, wherein the power supply is coupled to the input port, and is configured to supply electric power to the external load when the power switch is turned on.

21. The power circuit of claim 18, wherein the power circuit is configured to measure the inductance of the external load after determining that the measured resistance is smaller than the first pre-determined threshold.

22. The power circuit of claim 18, wherein the power circuit is configured to keep the power switch turned off when the measured resistance of the external load is smaller than the first pre-determined threshold, and the measured inductance of the external load is larger than the second pre-determined threshold.

* * * * *